(12) United States Patent
Yuan et al.

(10) Patent No.: US 8,846,466 B2
(45) Date of Patent: Sep. 30, 2014

(54) FORMING INTER-DEVICE STI REGIONS AND INTRA-DEVICE STI REGIONS USING DIFFERENT DIELECTRIC MATERIALS

(71) Applicant: Taiwan Semiconductor Manufacturing Company, Ltd., Hsin-Chu (TW)

(72) Inventors: Feng Yuan, Yonghe (TW); Tsung-Lin Lee, Hsin-Chu (TW); Hung-Ming Chen, Hsin-Chu (TW); Chang-Yun Chang, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/019,338

(22) Filed: Sep. 5, 2013

(65) Prior Publication Data

US 2014/0004682 A1 Jan. 2, 2014

Related U.S. Application Data

(63) Continuation of application No. 12/843,658, filed on Jul. 26, 2010, now Pat. No. 8,592,918.

(60) Provisional application No. 61/255,724, filed on Oct. 28, 2009.

(51) Int. Cl.

| H01L 21/336 | (2006.01) |
| H01L 27/12 | (2006.01) |
| H01L 21/84 | (2006.01) |
| H01L 21/762 | (2006.01) |
| H01L 27/088 | (2006.01) |
| H01L 21/8234 | (2006.01) |

(52) U.S. Cl.
CPC ...... *H01L 21/76224* (2013.01); *H01L 27/1211* (2013.01); *H01L 21/845* (2013.01); *H01L 21/76229* (2013.01); *H01L 27/0886* (2013.01); *H01L 21/823431* (2013.01)
USPC .......................................................... 438/197

(58) Field of Classification Search
CPC ................. H01L 21/76229; H01L 21/823431; H01L 21/76224; H01L 27/1211; H01L 21/845
USPC ................... 438/197, 167, 424; 257/E21.404
See application file for complete search history.

(56) References Cited

U.S. PATENT DOCUMENTS

| 6,706,571 B1 | 3/2004 | Yu et al. |
| 6,858,478 B2 | 2/2005 | Chau et al. |
| 7,190,050 B2 | 3/2007 | King et al. |

(Continued)

FOREIGN PATENT DOCUMENTS

| JP | 11-163329 | 6/1999 |
| WO | WO2005074035 A1 | 8/2005 |
| WO | WO2006006438 A1 | 1/2006 |

*Primary Examiner* — Elias M Ullah
(74) *Attorney, Agent, or Firm* — Slater & Matsil, L.L.P.

(57) ABSTRACT

An integrated circuit structure includes a substrate having a first portion in a first device region and a second portion in a second device region; and two insulation regions in the first device region and over the substrate. The two insulation regions include a first dielectric material having a first k value. A semiconductor strip is between and adjoining the two insulation regions, with a top portion of the semiconductor strip forming a semiconductor fin over top surfaces of the two insulation regions. An additional insulation region is in the second device region and over the substrate. The additional insulation region includes a second dielectric material having a second k value greater than the first k value.

20 Claims, 11 Drawing Sheets

(56) References Cited

U.S. PATENT DOCUMENTS

| | | |
|---|---|---|
| 7,247,887 B2 | 7/2007 | King et al. |
| 7,265,008 B2 | 9/2007 | King et al. |
| 7,508,031 B2 | 3/2009 | Liu et al. |
| 7,528,465 B2 | 5/2009 | King et al. |
| 7,605,449 B2 | 10/2009 | Liu et al. |
| 7,719,043 B2 | 5/2010 | Yamagami et al. |
| 2005/0153490 A1 | 7/2005 | Yoon et al. |
| 2007/0019479 A1 | 1/2007 | Kim et al. |
| 2007/0120156 A1 | 5/2007 | Liu et al. |
| 2007/0122953 A1 | 5/2007 | Liu et al. |
| 2007/0122954 A1 | 5/2007 | Liu et al. |
| 2007/0128782 A1 | 6/2007 | Liu et al. |
| 2007/0132053 A1 | 6/2007 | King et al. |
| 2008/0157225 A1 | 7/2008 | Datta et al. |
| 2008/0290470 A1 | 11/2008 | King et al. |
| 2008/0296632 A1 | 12/2008 | Moroz et al. |
| 2009/0181477 A1 | 7/2009 | King et al. |
| 2011/0260250 A1 | 10/2011 | Miller et al. |

US 8,846,466 B2

FORMING INTER-DEVICE STI REGIONS AND INTRA-DEVICE STI REGIONS USING DIFFERENT DIELECTRIC MATERIALS

This application is a continuation of U.S. patent application Ser. No. 12/843,658, filed on Jul. 26, 2010, and entitled "Forming Inter-Device STI Regions and Intra-Device STI Regions Using Different Dielectric Materials," which application further claims the benefit of U.S. Provisional Application No. 61/255,724, filed on Oct. 28, 2009, and entitled "Forming Inter-Device STI Regions and Intra-Device STI Regions Using Different Dielectric Materials," which applications are hereby incorporated herein by reference.

TECHNICAL FIELD

This application relates generally to integrated circuits and more particularly to semiconductor fins and Fin field-effect transistors (FinFETs) and methods of forming the same.

BACKGROUND

With the increasing down-scaling of integrated circuits and increasing demanding requirements to the speed of integrated circuits, transistors need to have higher drive currents with increasingly smaller dimensions. Fin field-effect transistors (FinFETs) were thus developed. FIG. 1 illustrates a cross-sectional view of a conventional FinFET, wherein the cross-sectional view is made crossing the fins rather than the source and drain regions. Fins 100 are formed as vertical silicon fins extending above substrate 102 and are used to form source and drain regions (not shown) and channel regions therebetween. The formation of fins 100 include recessing substrate 102 to form recesses, filling the recesses with a dielectric material, performing a chemical mechanical polish (CMP) to remove excess portions of the dielectric material above fins 100, and recessing a top layer of the dielectric material, so that the remaining portions of the dielectric material in the recesses form shallow trench isolation (STI) regions 120. STI regions 120 typically comprise silicon oxide. Gate 108 is formed over fins 100. Gate dielectric 106 is formed to separate fins 100 from gate 108.

Parasitic capacitors 110 are generated between gate 108 and fins 100, wherein STI regions 120 act as the insulators of parasitic capacitors 110. The capacitance values of parasitic capacitors 110 are the functions of the shape of STI regions 120 and the materials (such as k values) of STI regions 120. The parasitic capacitance adversely affects the performance of the respective integrated circuit and needs to be reduced.

SUMMARY

In accordance with one aspect of the embodiment, an integrated circuit structure includes a substrate having a first portion in a first device region and a second portion in a second device region; and two insulation regions in the first device region and over the substrate. The two insulation regions include a first dielectric material having a first k value. A semiconductor strip is between and adjoining the two insulation regions, with a top portion of the semiconductor strip forming a semiconductor fin over top surfaces of the two insulation regions. An additional insulation region is in the second device region and over the substrate. The additional insulation region includes a second dielectric material having a second k value greater than the first k value.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 2 through 10A are cross-sectional views of intermediate stages in the manufacturing of FinFETs in accordance with an embodiment.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments and do not limit the scope of the disclosure.

A novel method for forming fin field-effect transistors (FinFETs) is provided. The intermediate stages in the manufacturing of an embodiment are illustrated. The variations of the embodiment are discussed. Throughout the various views and illustrative embodiments, like reference numbers are used to designate like elements.

Figure 1:
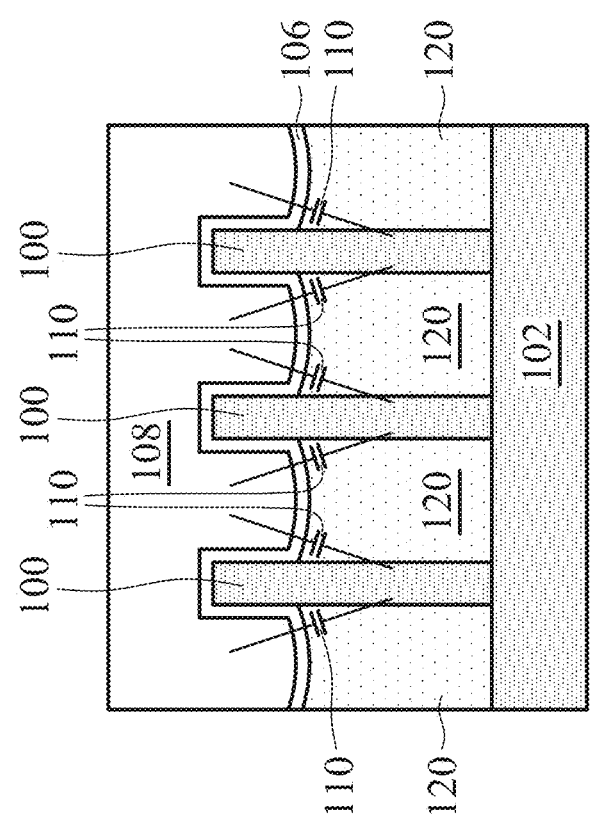
FIG. 1 illustrates a cross-sectional view of a conventional FinFET.
Figure 2:
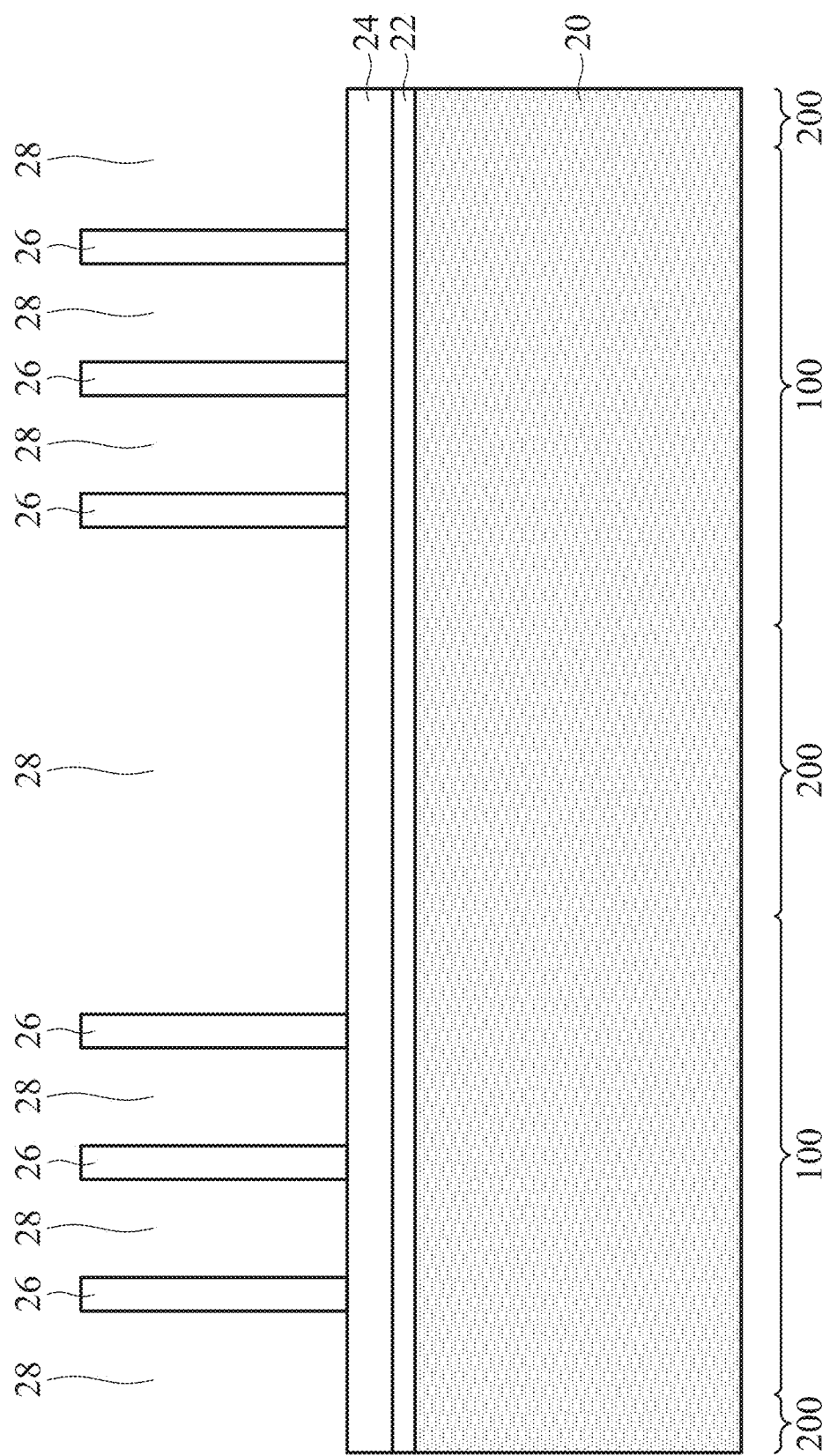

Referring to FIG. 2, semiconductor substrate 20 is provided. In an embodiment, semiconductor substrate 20 includes silicon. Other commonly used materials, such as carbon, germanium, gallium, arsenic, nitrogen, indium, and/or phosphorus, and the like, may also be included in semiconductor substrate 20. Semiconductor substrate 20 may be a bulk substrate or a semiconductor-on-insulator (SOI) substrate. Semiconductor substrate 20 includes portions in intra-device regions 100 and portions in inter-device regions 200. Each of intra-device regions 100 may be used to form a FinFET, while intra-device regions 100 may be separated from each other by inter-device regions 200, which may not have FinFETs formed therein. Inter-device regions 200 may, or may not, be directly between two FinFETs.

Pad layer 22 and mask layer 24 may be formed on semiconductor substrate 20. Pad layer 22 may be a thin film comprising silicon oxide formed, for example, using a thermal oxidation process. Pad layer 22 may act as an adhesion layer between semiconductor substrate 20 and mask layer 24. Pad layer 22 may also act as an etch stop layer for etching mask layer 24. In an embodiment, mask layer 24 is formed of silicon nitride, for example, using low-pressure chemical vapor deposition (LPCVD). In other embodiments, mask layer 24 is formed by thermal nitridation of silicon, plasma enhanced chemical vapor deposition (PECVD), or plasma anodic nitridation. Mask layer 24 is used as a hard mask during subsequent photolithography processes. Photo resist 26 is formed on mask layer 24 and is then patterned, forming openings 28 in photo resist 26.

Figure 3:
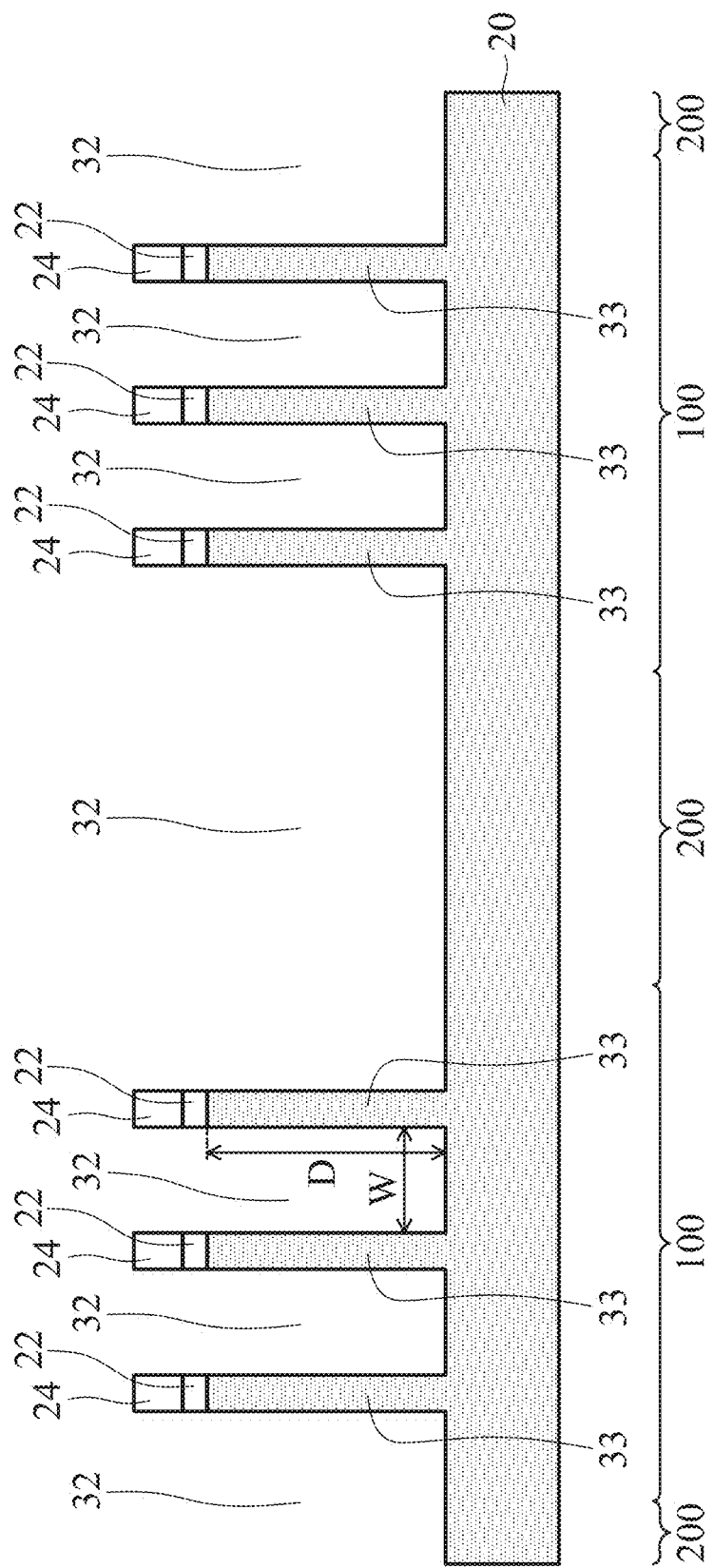

Referring to FIG. 3, mask layer 24 and pad layer 22 are etched through openings 28, exposing underlying semiconductor substrate 20. The exposed semiconductor substrate 20 is then etched forming trenches 32 and semiconductor strips 33, which are the portions of semiconductor substrate 20 between trenches 32. Trenches 32 may be strips (in the top view) parallel to each other and closely located to each other. Photo resist 26 is then removed. Next, a cleaning may be performed to remove a native oxide of semiconductor substrate 20. The cleaning may be performed using diluted hydrofluoric (HF) acid.

Depth D of trenches 32 may be between about 2100 Å and about 2500 Å, while width W may be between about 300 Å and about 1500 Å. In an exemplary embodiment, the aspect ratio (D/W) of trenches 32 is greater than about 7.0. In other exemplary embodiments, the aspect ratio may even be greater than about 8.0, although it may also be lower than about 7.0, or between 7.0 and 8.0. One skilled in the art will realize, however, that the dimensions and values recited throughout the descriptions are merely examples, and may be changed to suit different scales of integrated circuits.

Figure 4:
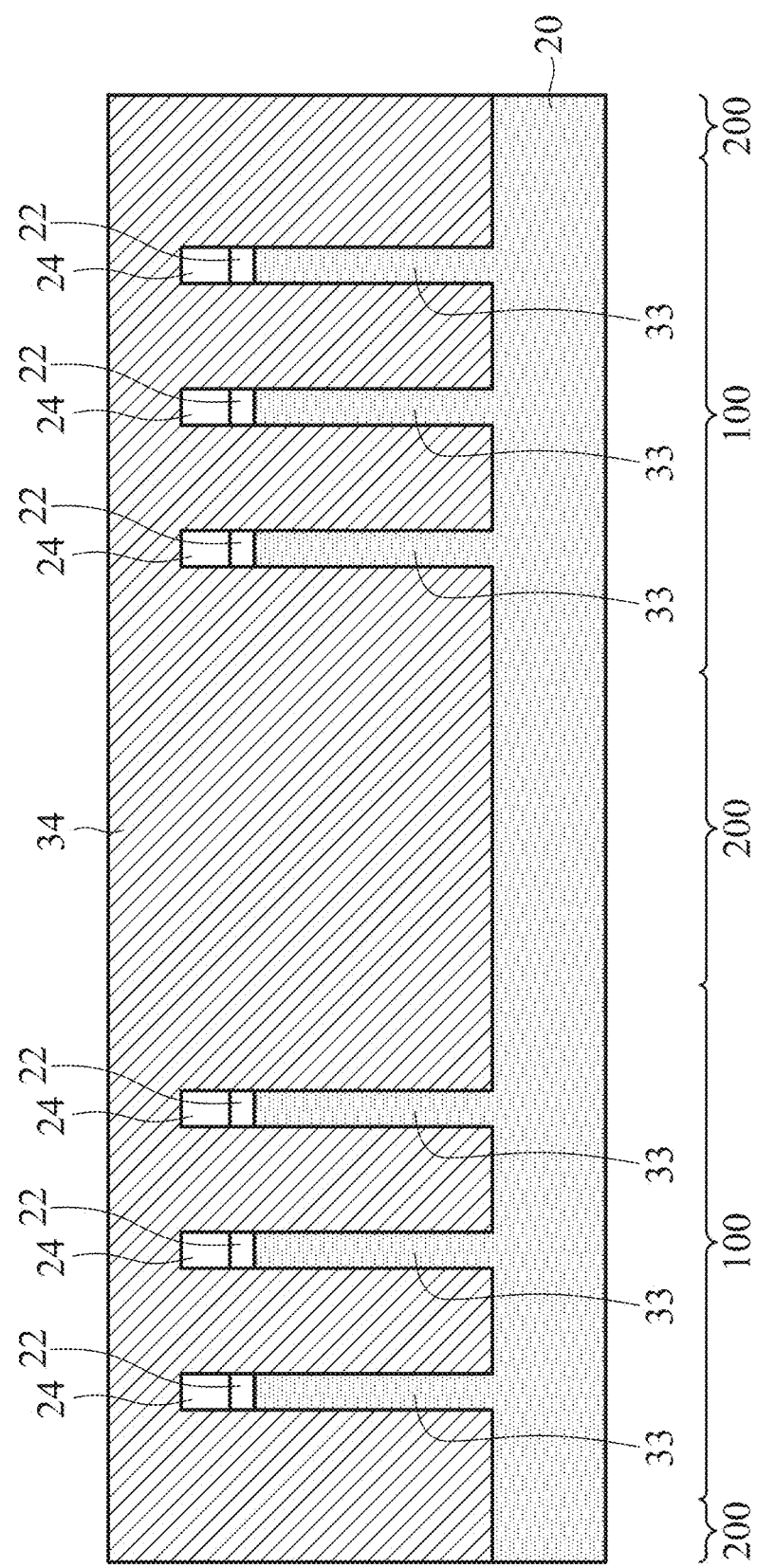

Referring to FIG. 4, low-k dielectric material 34 is filled into trenches 32. Optionally, a liner oxide (not shown) may be formed in trenches 32. In an embodiment, the liner oxide may be a thermal oxide. In other embodiments, the liner oxide may be formed using in-situ steam generation (ISSG). In yet other embodiments, the liner oxide may be formed using selective area chemical vapor deposition (SACVD) or other commonly used CVD methods. The formation of the liner oxide rounds the corners of trenches 32, which reduces the electrical fields and hence improves the performance of the resulting integrated circuit.

Low-k dielectric material 34 has a k value less than 3.9. The k value of low-k dielectric material 34 may also be less than about 3.5, 3.0, 2.5, or even less than about 2.0. In an embodiment, low-k dielectric material 34 comprises carbon-containing low-k dielectric materials. In other embodiments, low-k dielectric material 34 comprises other commonly known low-k materials, such as boro-phospho-silicate glass (BPSG), phospho-silicate glass (PSG), and/or the like.

Figure 5:
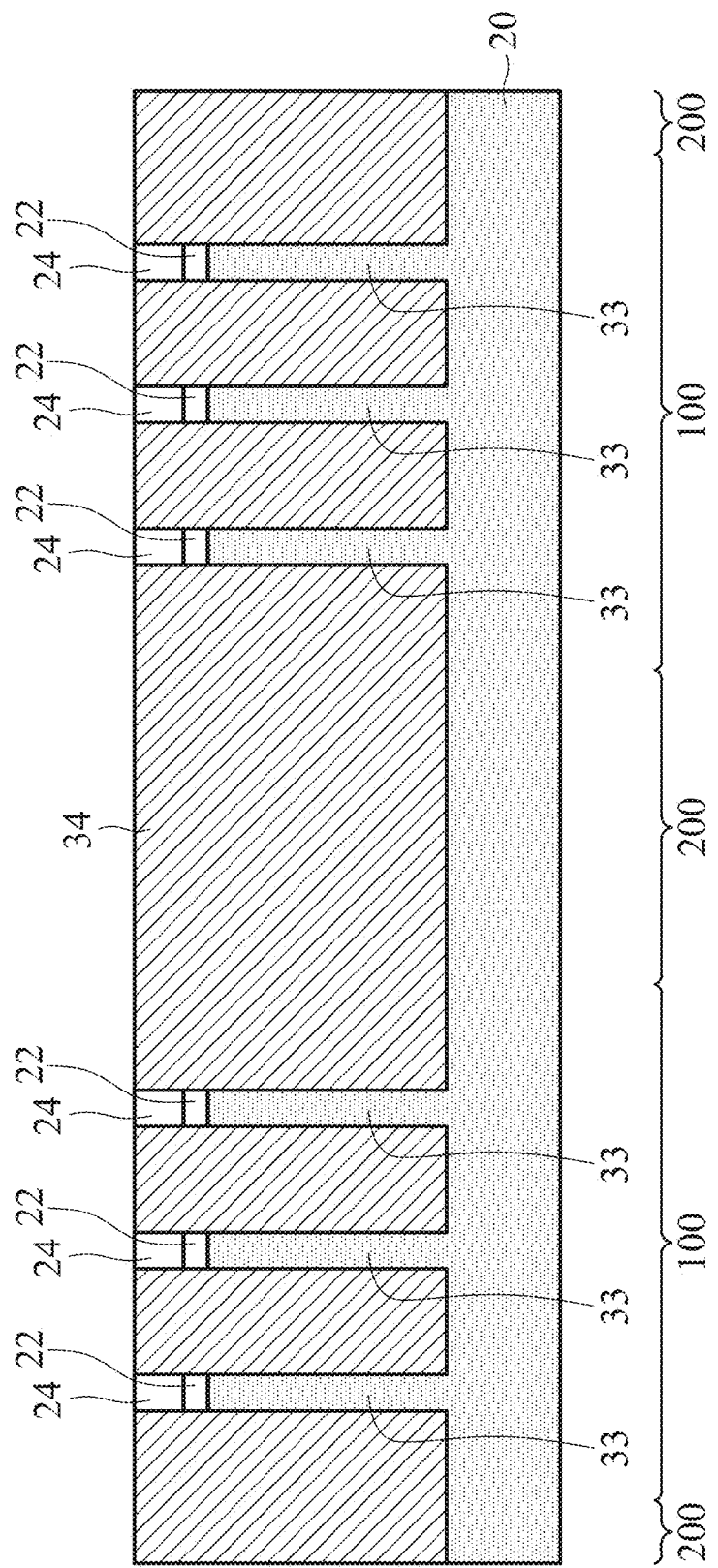
Figure 6:
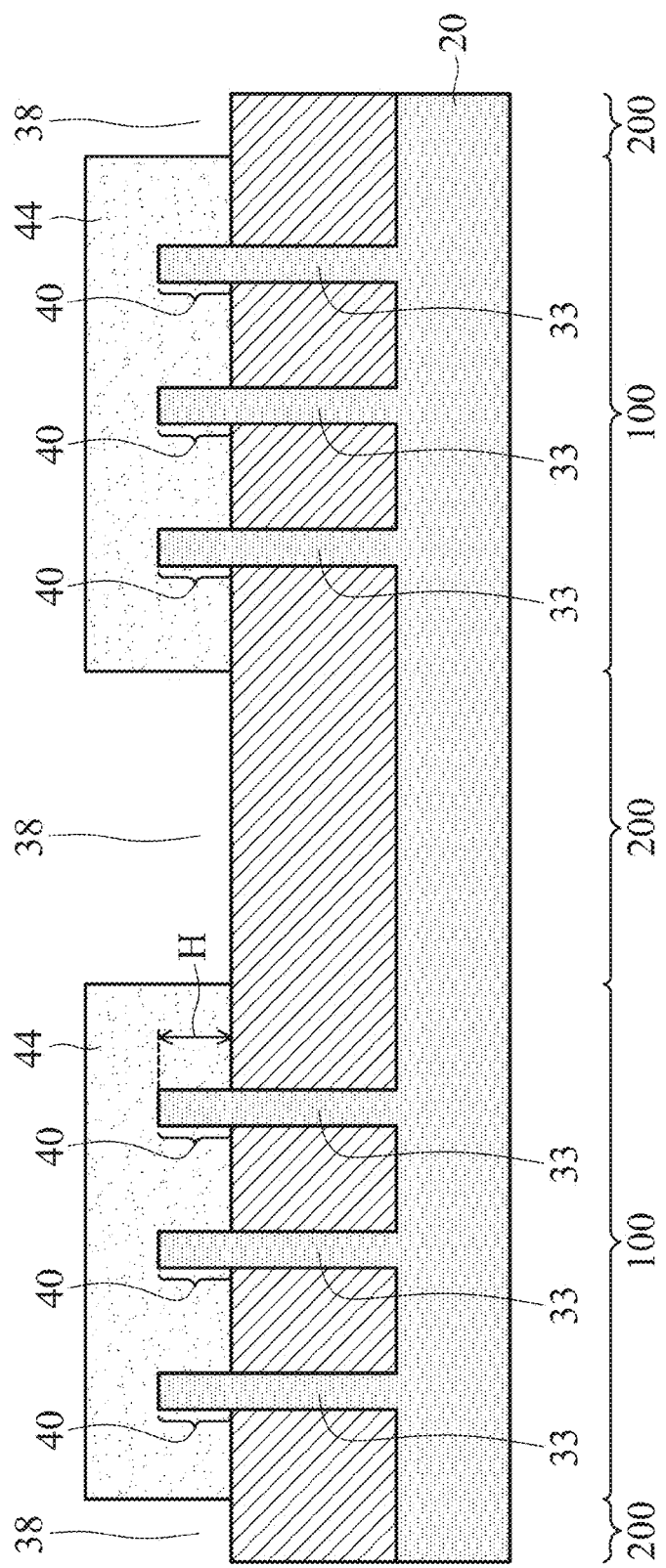

A chemical mechanical polish is then performed to level the top surface of low-k dielectric material 34 to the top surface of mask layer 24. The resulting structure is shown in FIG. 5. Low-k dielectric material 34 is then recessed by an etching step, resulting in recesses 38 as shown in FIG. 6. The remaining portions of pad layer 22 and mask layer 24 are also removed. The portions of semiconductor strips 33 protruding out of the top surfaces of the remaining low-k dielectric material 34 thus become fins 40. Height H of fins 40 may be between 15 nm and about 50 nm, although it may also be greater or smaller.

Figure 7:
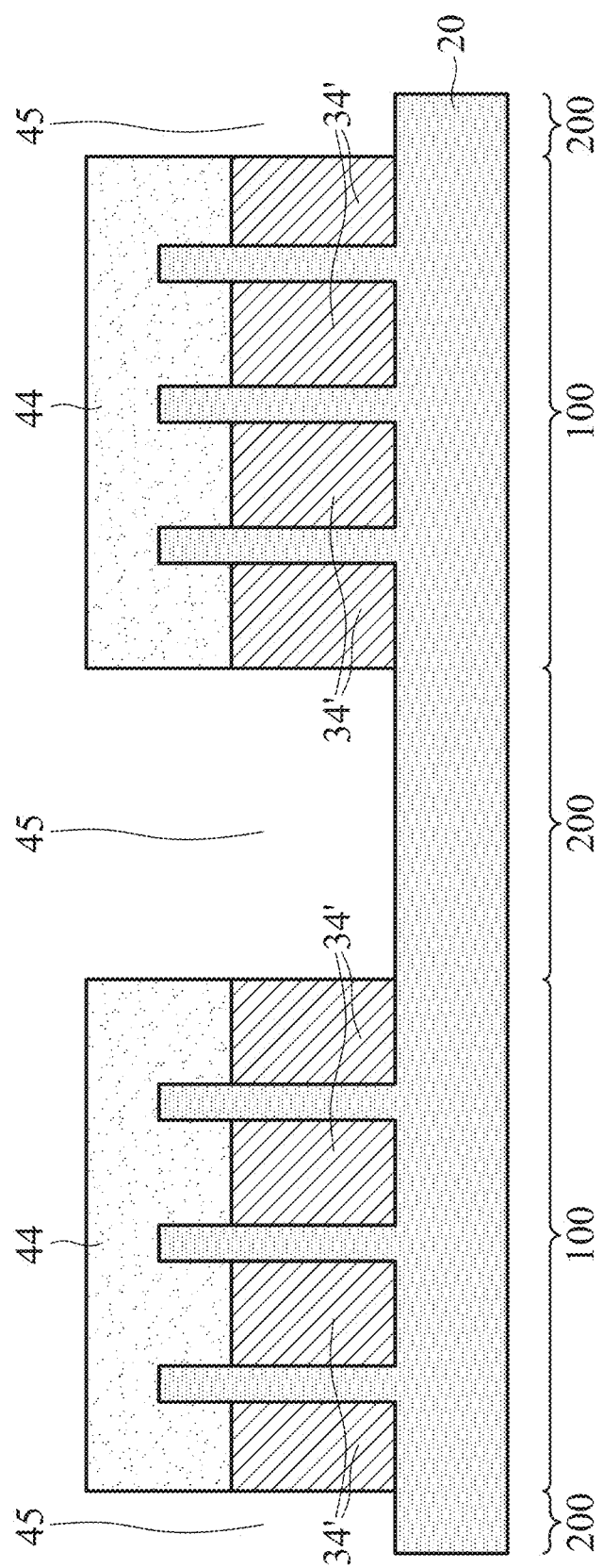

Next, as also shown in FIG. 6, hard mask 44, which may be formed of silicon nitride, is formed to cover intra-device regions 100, while inter-device regions 200 are left un-covered. An etching process is then performed to remove exposed portions of low-k dielectric material 34 from inter-device regions 200, forming recesses 45, as shown in FIG. 7. The portions of low-k dielectric material 34 in intra-device regions 100 are not removed, and are referred to as intra-device shallow trench isolation (STI) regions 34' hereinafter.

Figure 8:
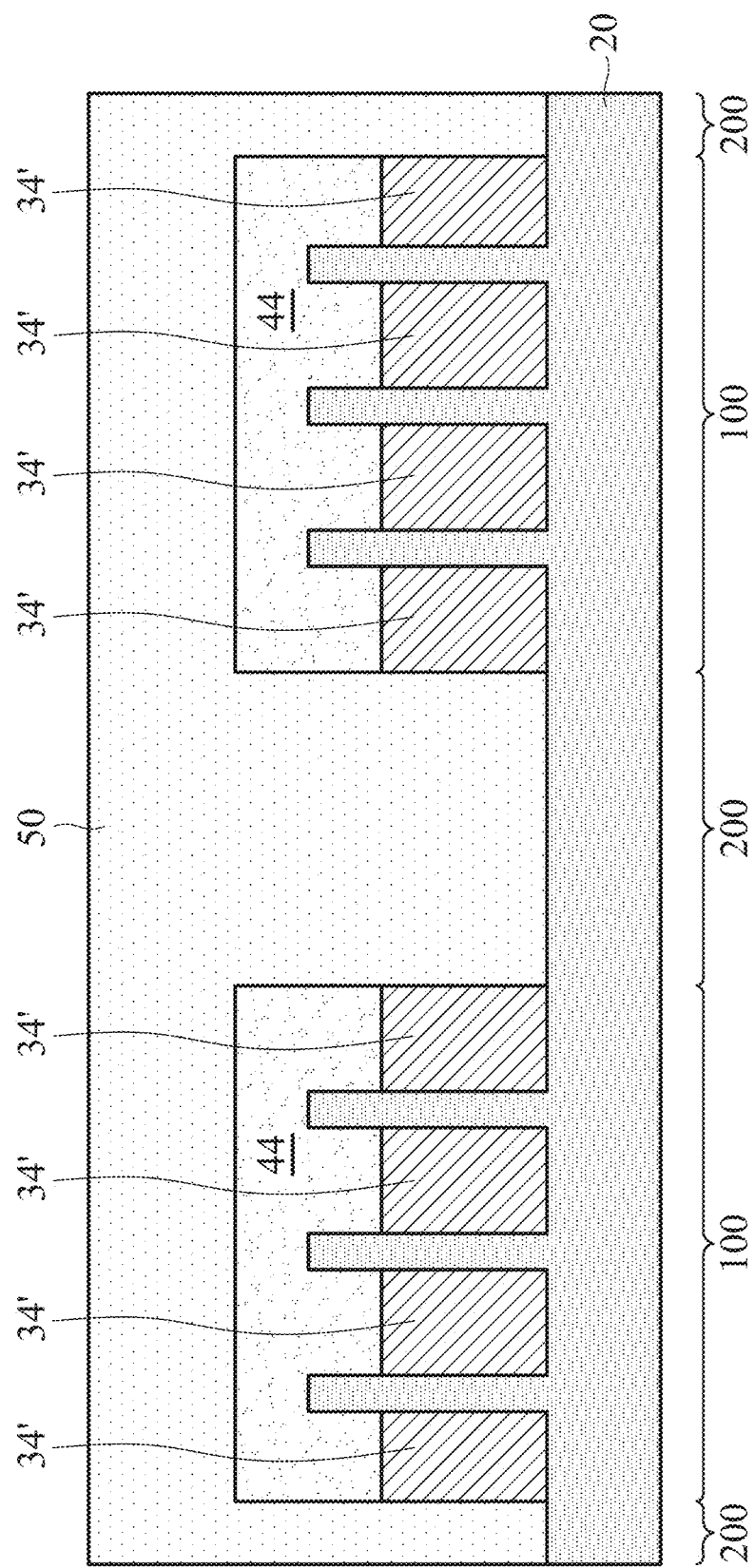

In FIG. 8, dielectric material 50 is filled in recesses 45. Dielectric material 50 has a k value greater than the k value of low-k dielectric material 34. In an embodiment, dielectric material 50 is formed of a non-low-k dielectric material having a k value equal to, or greater than, 3.9. The k value of dielectric material 50 may also be greater than about 5.0. In an exemplary embodiment, dielectric material 50 comprises silicon oxide, which may be formed of a chemical vapor deposition method (CVD) such as sub-atmospheric CVD (SACVD), high density plasma CVD (HDPCVD), or the like. The top surface of dielectric material 50 is higher than the top surface of hard mask 44.

Figure 9:
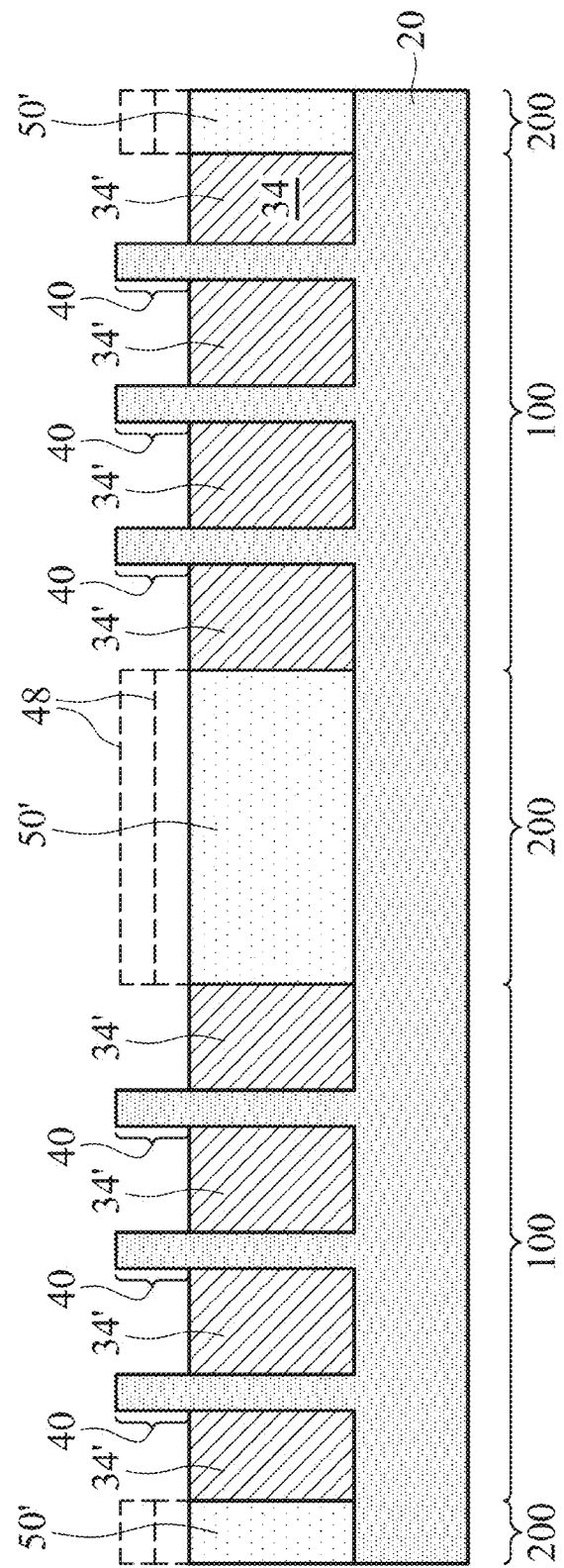

A CMP is performed to level the top surface of dielectric material 50 with the top surface of hard mask 44. An etching is then performed to further recess the top surface of remaining dielectric material 50. The resulting structure is shown in FIG. 9. Throughout the description, the remaining portions of dielectric material 50 are alternatively referred to as inter-device STI regions 50'. In an embodiment, after the etching step, the recessed top surface of inter-device STI regions 50' is substantially level with the top surface of intra-device STI regions 34'. In alternative embodiments, as shown with dotted lines 48, the recessed top surface of inter-device STI regions 50' is substantially level with the top surfaces of fins 40, or at any level between the surfaces of fins 40 and the top surface of intra-device STI regions 34'. The bottom surfaces of inter-device STI regions 50' and intra-device STI regions 34' may be level with each other. Hard mask 44 is then removed. In the resulting structure, inter-device STI regions 50' and intra-device STI regions 34' may also be considered to be over semiconductor substrate 20 (although they are originally formed inside semiconductor substrate 20).

Although in the above-described embodiment, intra-device STI regions 34' are formed before the formation of inter-device STI regions 50', intra-device STI regions 34' may also be formed after the formation of inter-device STI regions 50'. In this embodiment, in the step shown in FIG. 4, non-low-k dielectric material 50 is filled into trenches 32. In steps 7 and 8, portions of non-low-k dielectric material 50 will be removed from intra-device regions 100 to form recesses, and low-k dielectric material 34 will be filled into the recesses. One skilled in the art will realize the formation process by the applied teaching provided in preceding paragraphs.

Figure 10A:
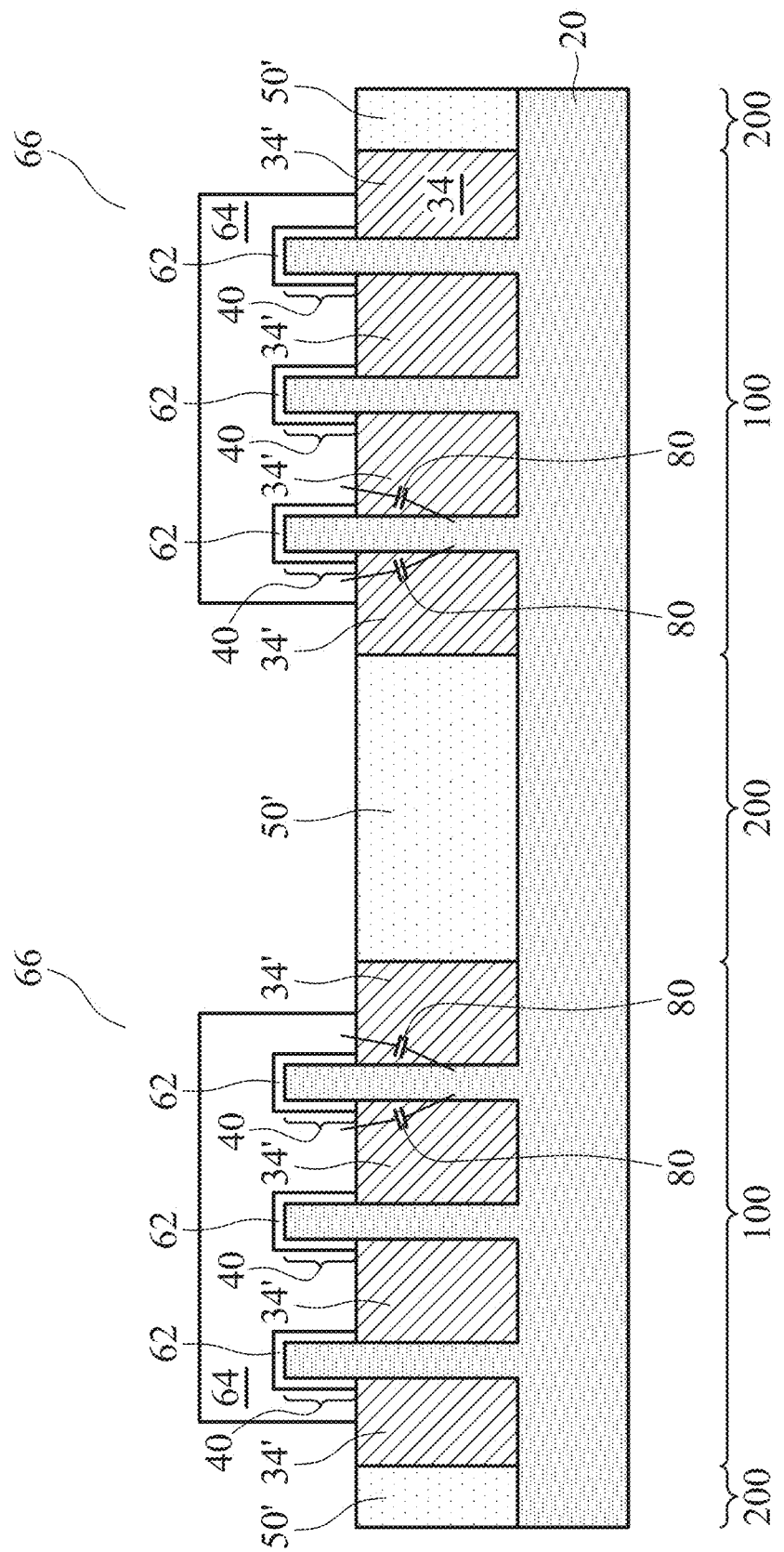

Referring to FIG. 10A, gate dielectric 62 is formed to cover the top surface and sidewalls of fins 40. Gate dielectric 62 may be formed by thermal oxidation and hence may include thermal silicon oxide. In this embodiment, gate dielectric 62 is formed on the top surfaces of fins 40, but not on the top surfaces of intra-device STI regions 34'. Alternatively, Gate dielectric 62 may be formed by a deposition step. Accordingly, gate dielectric 62 is formed on the top surfaces of fins 40 and the top surfaces of intra-device STI regions 34'. Gate electrode 64 is then formed on gate dielectric 62. In an embodiment, as shown in FIG. 10A, gate electrode 64 covers more than one fin 40, so that each of the resulting FinFETs 66 comprise more than one fin 40. In alternative embodiments, each of fins 40 may be used to form one FinFET.

Figure 10B:
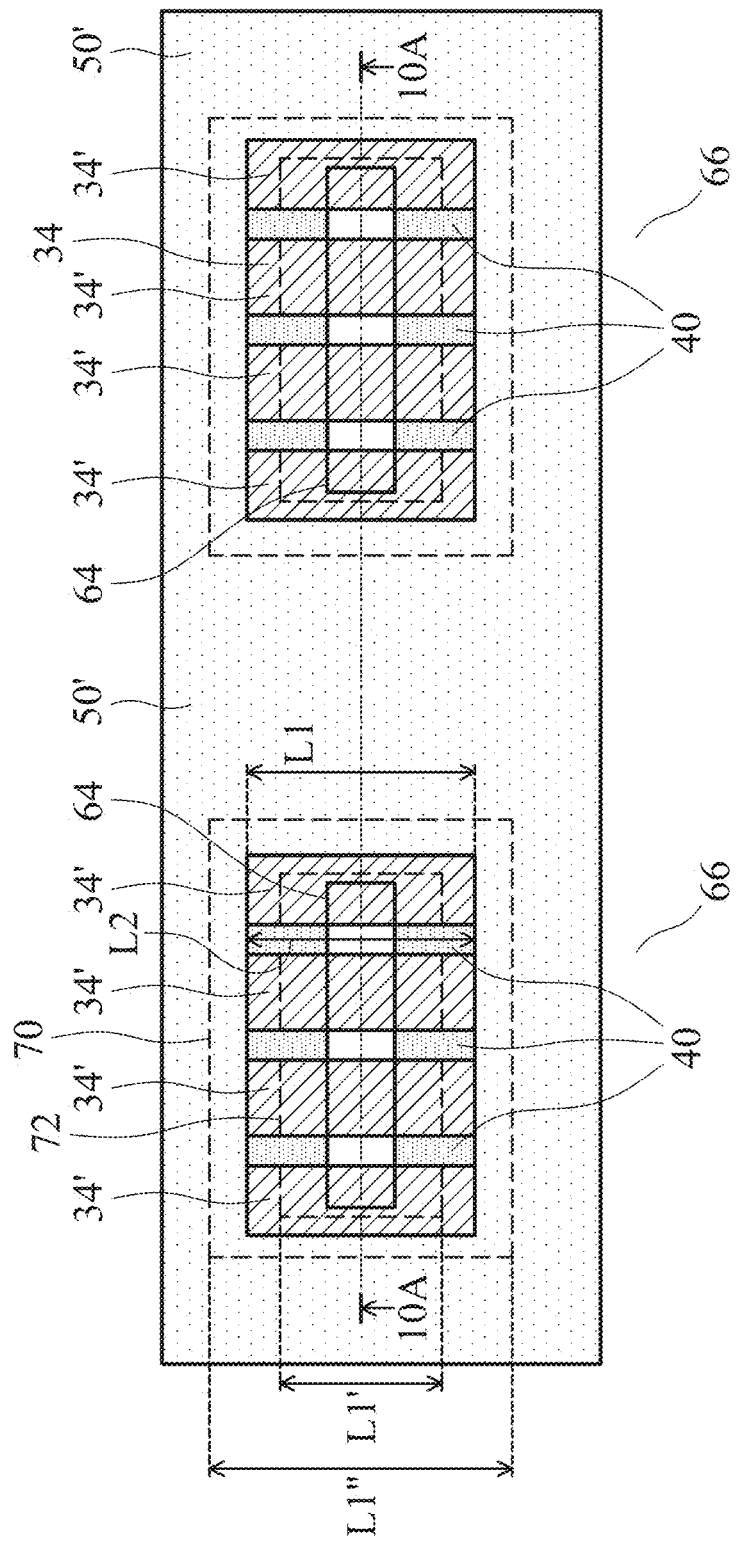
FIG. 10B illustrates a top view of the structure shown in FIG. 10A.

FIG. 10B illustrates a top view of the structure shown in FIG. 10A, wherein the cross-sectional view in FIG. 10A is obtained from the plane crossing line 10A-10A in FIG. 10B. It is observed that intra-device STI regions 34' may be encircled by inter-device STI regions 50'. However, the size of intra-device STI regions 34' may be greater or smaller, with the corresponding boundaries shown by dotted lines 70 and 72, respectively. In an embodiment, length L1 of intra-device STI regions 34' is equal to length L2 of fins 40. In other embodiments, as shown by dotted lines 72, length L1' of intra-device STI regions 34' is smaller than length L2 of fins 40. In yet other embodiments, as shown by dotted lines 70, length L1" of intra-device STI regions 34' is greater than length L2 of fins 40. The remaining components of FinFETs 66, including source and drain regions and source and drain silicides (not shown in FIG. 10A and 10B) are then formed on the portions of fins 40 not covered by gate electrodes 64. The formation processes of these components are known in the art, and hence are not repeated herein.

The embodiments have several advantageous features. Since the capacitance of a capacitor is proportional to the k value of the capacitor insulator, by using low-k dielectric materials to form intra-device STI regions, the parasitic gate capacitance (shown as capacitors 80 in FIG. 10A) of the FinFETs is reduced and the speed of the respective FinFETs may be increased. However, since the inter-device STI regions may still be formed using normal STI materials, the stresses caused by the using of low-k dielectric materials in the intra-device STI regions are minimized.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment and the combination of various claims and embodiments are within the scope of the disclosure.

What is claimed is:

1. A method of forming an integrated circuit structure, the method comprising:
   providing a substrate comprising a first portion in a first device region and a second portion in a second device region;
   forming two insulation regions in the first device region and over the substrate, the two insulation regions comprising a first dielectric material having a first k value;
   forming a first semiconductor strip between and adjoining the two insulation regions, a top portion of the first semiconductor strip forming a first semiconductor fin over top surfaces of the two insulation regions; and
   forming an additional insulation region in the second device region and over the substrate, the additional insulation region comprising a second dielectric material having a second k value greater than the first k value.

2. The method of claim 1, wherein the steps of forming the two insulation regions and the additional insulation region comprise:
   etching the substrate to form first recesses;
   filling the first recesses with the first dielectric material to form the two insulation regions and a sacrificial insulation region;
   removing the sacrificial insulation region to form a second recess; and
   filling the second recess with the second dielectric material to form the additional insulation region.

3. The method of claim 2 further comprising:
   after the step of filling the first recesses, recessing the top surfaces of the two insulation regions to a level lower than a top surface of the first semiconductor strip to form the first semiconductor fin.

4. The method of claim 1, wherein the first dielectric material is a low-k dielectric material.

5. The method of claim 1, wherein the second dielectric material comprises silicon oxide.

6. The method of claim 1, wherein one of the two insulation regions is encircled by the additional insulation region.

7. The method of claim 1 further comprising:
   forming a gate dielectric on a top surface and sidewalls of the first semiconductor fin; and
   forming a gate electrode over the gate dielectric, the gate electrode comprising a portion directly over a portion of the two insulation regions.

8. The method of claim 1 further comprising forming a second semiconductor strip comprising a second semiconductor fin over the top surfaces of the two insulation regions, one of the two insulation regions being between and adjoining the first semiconductor strip and the second semiconductor strip.

9. A method of forming an integrated circuit structure, the method comprising:
   providing a semiconductor substrate;
   etching the semiconductor substrate to form first recesses;
   filling the first recesses with a first dielectric material having a first k value to form first shallow trench isolation (STI) regions;
   removing portions of the first STI regions to form second recesses;
   filling the second recesses with a second dielectric material having a second k value to form second STI regions, the first k value being different from the second k value;
   recessing one of the first STI regions and the second STI regions to form a semiconductor fin, the semiconductor fin being over a top surface of the one of the first STI regions and the second STI regions;
   forming a gate dielectric on a top surface and sidewalls of the semiconductor fin; and
   forming a gate electrode over the gate dielectric.

10. The method of claim 9, wherein the first STI regions are intra-device STI regions, the second STI regions are inter-device regions, the gate electrode extending directly over a portion of the intra-device STI regions, and the first k value being less than the second k value.

11. The method of claim 10, wherein the step of recessing the one of the first STI regions and the second STI regions to form the semiconductor fin is performed before the step of removing the portions of the first STI regions to form the second recesses.

12. The method of claim 9, wherein the first STI regions are inter-device STI regions, the second STI regions are intra-device STI regions, the gate electrode extending directly over a portion of the intra-device STI regions, and the first k value being greater than the second k value.

13. The method of claim 9, wherein one of the first k value and the second k value is less than 3.5.

14. The method of claim 9, wherein after the step of removing the portions of the first STI regions to form the second recesses, the semiconductor substrate is exposed through the second recesses.

15. A method of forming an integrated circuit structure, the method comprising:
   providing a semiconductor substrate comprising a first portion in a an intra-device region and a second portion in an inter-device region;
   forming an intra-device shallow-trench isolation (STI) region over the semiconductor substrate, the intra-device STI region being formed of a low-k dielectric material having a first k value;
   forming a first FinFET comprising:
      forming a semiconductor fin adjacent and over the intra-device STI region;
      forming a gate dielectric on the semiconductor fin; and forming a gate electrode over the gate dielectric, the gate electrode comprising a portion directly over the intra-device STI region; and forming an inter-device STI region over the semiconductor substrate, the inter-device STI region being formed of a non-low-k dielectric material having a second k value, the second k value being greater than the first k value.

16. The method of claim 15, wherein no gate electrode is formed directly over the inter-device STI region.

17. The method of claim 15 further comprising:
forming a second FinFET over the semiconductor substrate, the inter-device region being laterally between the first FinFET and the second FinFET.

18. The method of claim 15, wherein a first bottom surface of the intra-device STI region is level with a second bottom surface of the inter-device STI region.

19. The method of claim 15, wherein a sidewall of the intra-device STI region adjoins a sidewall of the inter-device STI region.

20. The method of claim 15, wherein the inter-device STI region encircles the intra-device STI region.

* * * * *